(12) United States Patent
Sasaki

(10) Patent No.: US 8,159,034 B2
(45) Date of Patent: Apr. 17, 2012

(54) SEMICONDUCTOR DEVICE HAVING INSULATED GATE FIELD EFFECT TRANSISTORS AND METHOD OF MANUFACTURING THE SAME

(75) Inventor: Toshiyuki Sasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 417 days.

(21) Appl. No.: 12/178,121

(22) Filed: Jul. 23, 2008

(65) Prior Publication Data
US 2009/0032882 A1 Feb. 5, 2009

(30) Foreign Application Priority Data

Jul. 23, 2007 (JP) ................................ 2007-190800

(51) Int. Cl.
*H01L 27/088* (2006.01)
*H01L 21/8238* (2006.01)

(52) U.S. Cl. ................... 257/369; 257/E27.06; 438/199

(58) Field of Classification Search .................... 257/369
See application file for complete search history.

(56) References Cited

U.S. PATENT DOCUMENTS

| | | | | |
|---|---|---|---|---|
| 4,931,411 A * | 6/1990 | Tigelaar et al. | ............... | 438/201 |
| 6,033,944 A * | 3/2000 | Shida | ............... | 438/199 |
| 6,166,413 A * | 12/2000 | Ono | ............... | 257/369 |
| 6,171,897 B1 * | 1/2001 | Takenaka | ............... | 438/232 |
| 6,346,445 B1 * | 2/2002 | Hsu | ............... | 438/279 |
| 6,855,605 B2 * | 2/2005 | Jurczak et al. | ............... | 438/275 |
| 7,075,158 B2 * | 7/2006 | Koyama et al. | ............... | 257/388 |
| 7,511,348 B2 * | 3/2009 | Ko et al. | ............... | 257/371 |
| 7,759,744 B2 * | 7/2010 | Kimizuka et al. | ............... | 257/406 |
| 2005/0260815 A1 * | 11/2005 | Liaw | ............... | 438/275 |
| 2006/0102962 A1 * | 5/2006 | Saito | ............... | 257/377 |
| 2007/0026600 A1 | 2/2007 | Komori | | |
| 2007/0069304 A1 | 3/2007 | Aida et al. | | |
| 2007/0281429 A1 * | 12/2007 | Sato | ............... | 438/294 |
| 2008/0315314 A1 * | 12/2008 | Cho | ............... | 257/365 |

FOREIGN PATENT DOCUMENTS

| | | |
|---|---|---|
| JP | 11-17024 | 1/1999 |
| TW | 200522270 | 7/2005 |
| TW | 200711044 | 3/2007 |
| TW | 200711046 | 3/2007 |

OTHER PUBLICATIONS

Examination Opinion Notification issued by the Taiwanese Patent Office on Jan. 30, 2012, for Taiwanese Patent Application No. 097127841, and English-language translation thereof.

* cited by examiner

*Primary Examiner* — N. Drew Richards
*Assistant Examiner* — Robert Carpenter
(74) *Attorney, Agent, or Firm* — Finnegan, Henderson, Farabow, Garrett & Dunner, L.L.P.

(57) ABSTRACT

N-type semiconductor region and P-type semiconductor region are provided in a surface region of a semiconductor substrate. Insulating film and silicon containing film are laminated on the semiconductor substrate. P-type impurities are introduced into a first portion of the silicon containing film above the N-type semiconductor region. The first portion of the silicon containing film is thinned in the thickness direction. N-type impurities are introduced into a second portion of the silicon containing film above the P-type semiconductor region. A mask is provided on the silicon containing film. The first and second portions of the silicon containing film are etched together using the mask as an etching mask to form gate electrode films above the N-type and P-type semiconductor regions respectively. P-type and N-type impurities are introduced into the N-type and P-type semiconductor regions to form P-type and N-type source and drain layers.

16 Claims, 11 Drawing Sheets

US 8,159,034 B2

SEMICONDUCTOR DEVICE HAVING INSULATED GATE FIELD EFFECT TRANSISTORS AND METHOD OF MANUFACTURING THE SAME

CROSS REFERENCE TO RELATED APPLICATION

This application is based upon and claims the benefit of priority from the prior Japanese Patent Application No. 2007-190800, filed on Jul. 23, 2007, the entire contents of which are incorporated herein by reference.

FIELD OF THE INVENTION

The present invention relates to a semiconductor device having insulated gate field effect transistors of different conductivity channel types which are formed on a semiconductor substrate, and also relates to a method of manufacturing the semiconductor device.

DESCRIPTION OF THE BACKGROUND

A CMOS (Complementary Metal Oxide Semiconductor) semiconductor device is widely used. The CMOS semiconductor device is provided with insulated gate field effect transistors of different conductivity channel types on a common semiconductor substrate. Gate electrodes of insulated gate field effect transistors of a CMOS semiconductor device need to have desired processed shapes, as development of miniaturization, lower voltage performance and higher integration of the insulated gate field effect transistors.

A method of forming gate electrodes of a CMOS semiconductor device is discloses in Japanese Patent Application Publication (Kokai) No. 11-17024. The CMOS semiconductor device is provided with N-channel and P-channel insulated gate field effect transistors. The N-channel insulated gate field effect transistor is provided with an $N^+$ gate electrode of $N^+$ polycrystalline silicon in which N-type impurities are contained in high concentration. The P-channel insulated gate field effect transistor is provided with a $P^+$ gate electrode of $P^+$ polycrystalline silicon in which P-type impurities are contained in high concentration.

A gate insulating film is formed on a semiconductor substrate to form N-channel and P-channel insulated gate field effect transistors. $N^+$ and $P^+$ polycrystalline silicon films are formed on the gate insulating film. These $N^+$ and $P^+$ polycrystalline silicon films are etched and processed at the same time by RIE (Reactive Ion Etching), for example, using an etching mask, so as to form $N^+$ and $P^+$ gate electrodes.

The gate insulating film under the $N^+$ polycrystalline silicon film may be over-etched or a surface portion of the semiconductor substrate may be scooped out, because the $N^+$ polycrystalline silicon film is etched at an etching rate larger than that of the $P^+$ polycrystalline silicon film. Further, the $P^+$ gate electrode may have a taper shape by the etching process. As a result, it may be difficult to form $N^+$ and $P^+$ gate electrodes with desired vertically-etched shapes at the same time.

SUMMARY OF THE INVENTION

According to an aspect of the invention, a semiconductor device is provided, which comprises a semiconductor substrate having a surface region, the surface region being provided with an N-type semiconductor region and a P-type semiconductor region, a P-channel insulated gate field effect transistor formed on the N-type semiconductor region, the P-channel insulated gate field effect transistor having a P-type source layer and a P-type drain layer formed apart from each other in the N-type semiconductor region, a first insulating film formed on the N-type semiconductor region, a first gate electrode film formed on the first insulating film and located above a region between the P-type source and drain layers and a second gate electrode film containing silicon and P-type impurities formed on the first gate electrode film, the first gate electrode film being made of a material different from that of the second gate electrode film, and an N-channel insulated gate field effect transistor formed on the P-type semiconductor region, the N-channel insulated gate field effect transistor having an N-type source layer and an N-type drain layer formed apart from each other in the P-type semiconductor region, a second insulating film formed on the P-type semiconductor region, a third gate electrode film containing silicon and N-type impurities formed on the second insulating film and located above a region between the N-type source and drain layers, the third gate electrode film being thicker than the second gate electrode film.

According to another aspect of the invention, a method of manufacturing a semiconductor device is provided, which comprises providing an N-type semiconductor region and a P-type semiconductor region in a surface region of a semiconductor substrate, forming an insulating film to be a gate insulating film on the semiconductor substrate, forming a silicon containing film on the insulating film, introducing P-type impurities into a first portion of the silicon containing film above the N-type semiconductor region, etching and thinning the first portion of the silicon containing film in a thickness direction of the first portion and introducing N-type impurities into a second portion of the silicon containing film above the P-type semiconductor region, providing an etching mask having first and second patterns on the silicon containing film to position the first and second patterns of the etching mask corresponding to gate electrode patterns above the thinned first and second portions of the silicon containing film respectively, and etching the thinned first and second portions together to form gate electrode films above the N-type and P-type semiconductor regions respectively, introducing P-type impurities into the N-type semiconductor region using the gate electrode film located above the N-type semiconductor region as a mask so as to form P-type source and drain layers in the N-type semiconductor region and introducing N-type impurities into the P-type semiconductor region using the gate electrode film located above the P-type semiconductor region as a mask so as to form N-type source and drain layers in the P-type semiconductor region.

According to further another aspect of the invention, a method of manufacturing a semiconductor device, which comprises providing an N-type semiconductor region and a P-type semiconductor region in a surface region of a semiconductor substrate, forming an insulating film to be a gate insulating film on the semiconductor substrate, forming a first silicon containing film on the insulating film, introducing P-type impurities into a first portion of the first silicon containing film above the N-type semiconductor region, forming a protection film on the first portion of the first silicon containing film selectively, forming a second silicon containing film covering the protection film and a second portion of the first silicon containing film above the P-type semiconductor region, polishing and flattening the second silicon containing film to leave the second silicon containing film partially above the second portion of the first silicon containing film so as to form a laminated silicon containing film and introducing N-type impurities into at least one of the second portion of the first silicon containing film and the remaining second silicon containing film, providing an etching mask having first and second patterns corresponding to gate electrode patterns to position the first and second patterns on the first portion of the first silicon containing film and the laminated silicon containing film respectively, and etching the first portion of the first silicon containing film and the laminated silicon containing film together to form gate electrode films above the N-type and P-type semiconductor regions respectively, introducing P-type impurities into the N-type semiconductor region using the gate electrode film located above the N-type semiconductor region as a mask so as to form P-type source and drain layers in the N-type semiconductor region and introducing N-type impurities into the P-type semiconductor region using the gate electrode film located above the P-type semiconductor region as a mask so as to form N-type source and drain layers in the P-type semiconductor region.

DETAILED DESCRIPTION OF THE INVENTION

Embodiments of the present invention will be described hereinafter with reference to the accompanying drawings.

A first embodiment of a method of manufacturing a semiconductor device according to the invention will be described with reference to FIGS. 1 to 8. FIGS. 1 to 8 are cross-sectional views showing manufacturing steps of the first embodiment.

Figure 1:
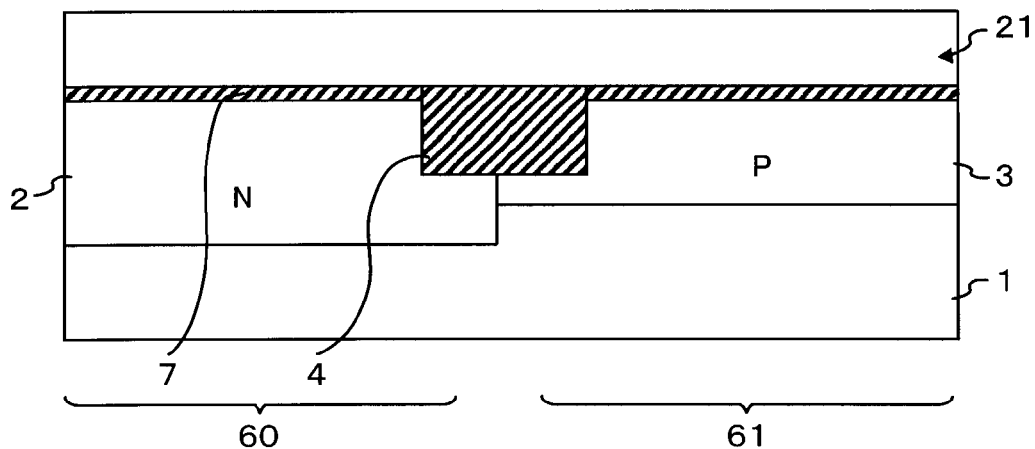
FIGS. 1 to 8 are cross-sectional views showing steps of a first embodiment of a method of manufacturing a semiconductor device according to the present invention.

As shown in FIG. 1, a semiconductor substrate 1 is prepared. The semiconductor substrate 1 is a silicon substrate of P-type. In the semiconductor substrate 1, an area 60 is defined to form a P-channel insulated gate field effect transistor (referred to as "P-channel MISFET hereinafter). In the semiconductor substrate 1, an area 61 is also defined to form an N-channel insulated gate field effect transistor (referred to as "N-channel MISFET hereinafter).

N-type and P-type well regions 2, 3 are selectively formed in a surface region of the semiconductor substrate 1. The N-type and P-type well regions 2, 3 serve as N-type and P-type semiconductor regions respectively. A shallow trench isolation layer 4 is buried in a region including an adjacent portion of the N-type and P-type well regions 2, 3 in the surface region of the semiconductor substrate 1.

An insulating film 7 for a gate insulating film and a polycrystalline silicon film 21 for a gate electrode are laminated on the semiconductor substrate 1. The insulating film 7 may be an oxidized silicon nitride film. Instead of the oxidized silicon nitride film, an oxidized silicon nitride/silicon oxide film or a High-K film such as a film containing hafnium, silicon, oxygen and nitrogen may be formed. The polycrystalline silicon film 21 may be an un-doped polycrystalline silicon film, for example. The polycrystalline silicon film may be formed by a CVD (Chemical Vapor Deposition) method or PVD (Physical Vapor Deposition) method.

Figure 2:
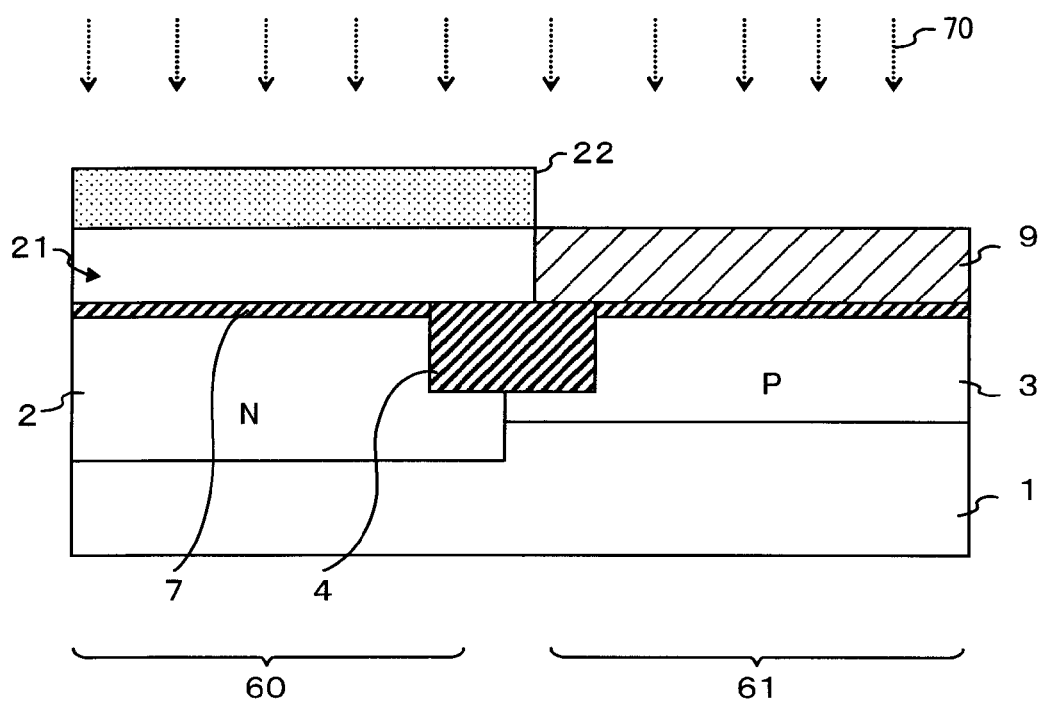

In FIG. 2, after the polycrystalline silicon film 21 is formed, a resist film 22 is selectively formed above the area 60 to form the P-channel MISFET using a well-known lithography method. N-type impurities, for example, phosphorus (P) ions 70 are implanted into the polycrystalline silicon film 21 above the area 61 to form the N-channel MISFET so that an $N^+$ polycrystalline silicon film is obtained.

Figure 3:
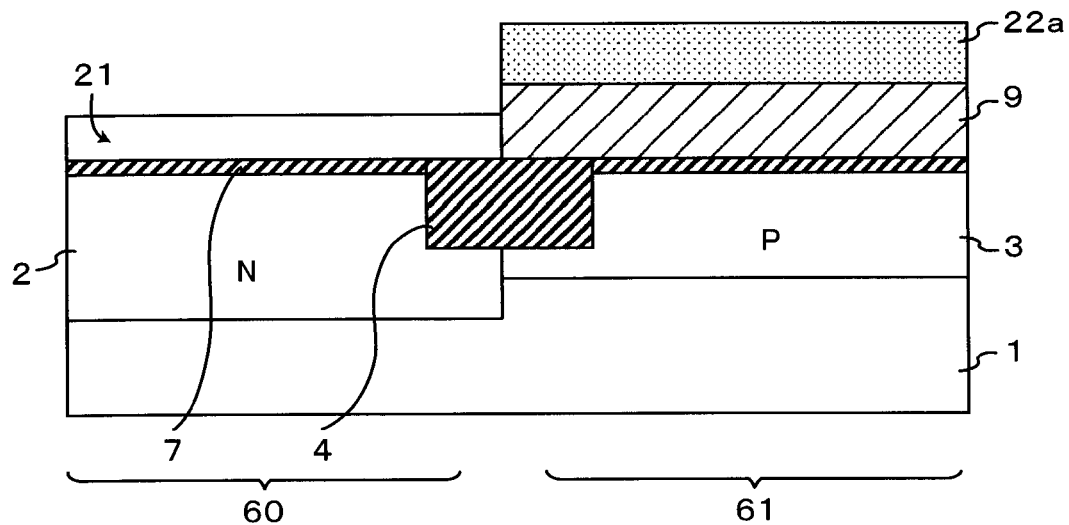

As shown in FIG. 3, after the resist film 22 is removed, a resist film 22a is selectively formed above the area 61 to form the N-channel MISFET using a well-known lithography method. The polycrystalline silicon film 21 above the area 60 is etched by the thickness that is predetermined below, using a RIE method, for example.

The etching rates of $N^+$ and $P^+$ polycrystalline silicon films are measured to form N-channel and P-channel MISFETs in order to determine the thickness to etch the polycrystalline silicon film 21. The thickness to be etched is decided so as to realize that the etching time periods to reach the etching end points of the $N^+$ and $P^+$ polycrystalline silicon films are substantially same when the etching is started at the same time, in consideration of the measured etching rates of the $N^+$ and $P^+$ polycrystalline silicon films and the thickness of the polycrystalline silicon film 21, as is described below.

The following expressions are given to decide the relationship between the thickness T1 of the $N^+$ polycrystalline silicon film and the thickness T2 of the $P^+$ polycrystalline silicon film. $\Delta T$ is equivalent to a compensation thickness to end the etching of the $N^+$ and $P^+$ polycrystalline silicon films at the same time.

$$T1 > T2 \tag{1}$$

$$T1 - T2 = \Delta T \tag{2}$$

Figure 4:
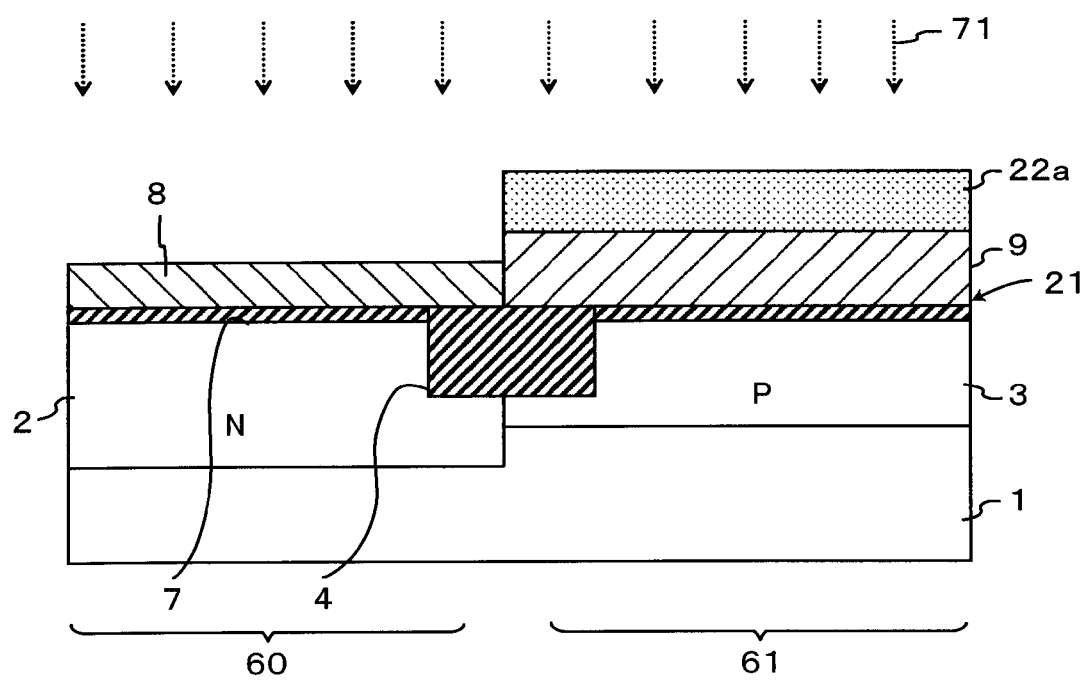

In FIG. 4, P-type impurities, for example, boron (B) ions 71 are implanted into the polycrystalline silicon film 21 above the area 60, using the resist film 22a as a mask, so that a $P^+$ polycrystalline silicon film 8 is obtained.

Figure 5:
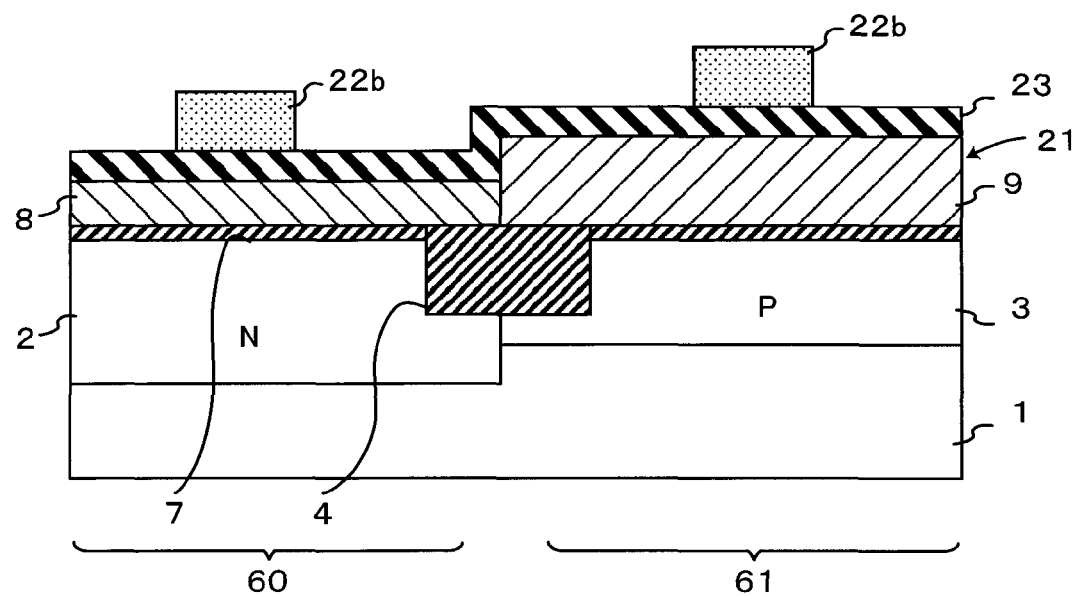

In FIG. 5, after the resist film 22a is removed, a hard mask 23 is formed on the polycrystalline silicon film 21. The hard mask 23 may be formed by using a CVD method for forming an insulating film such as a silicon-nitride (SiN) film or TEOS film. After the hard mask 23 is formed, a resist film 22b is selectively formed above regions to form gate electrodes, using a well-known lithography method.

Figure 6:
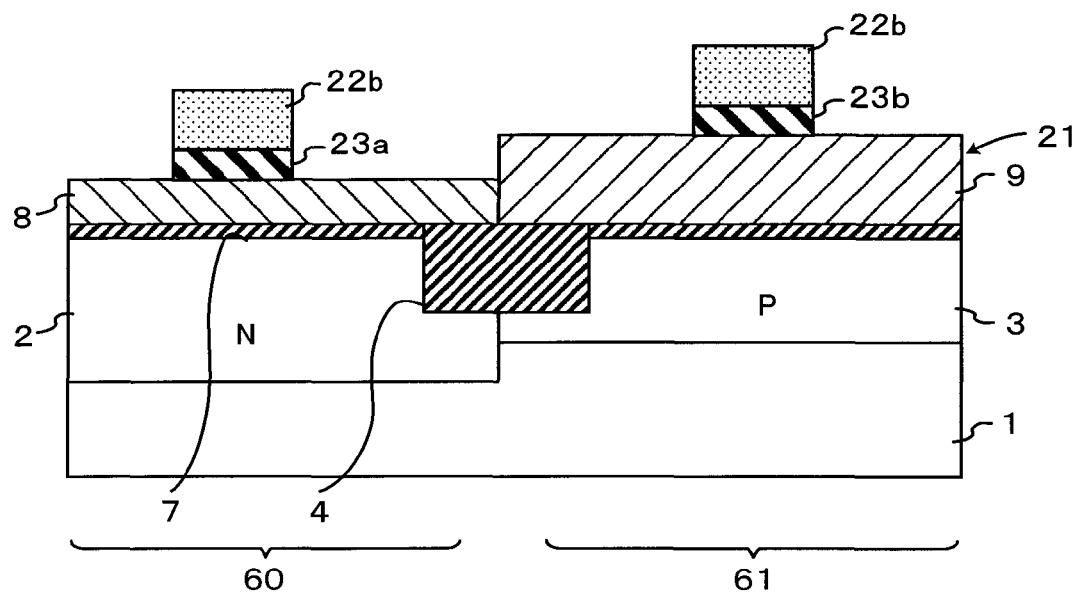

In FIG. 6, the hard mask 23 is etched utilizing a RIE method, for example, using the resist film 22b as an etching mask, so as to obtain hard mask patterns 23a, 23b.

The RIE method is carried out desirably under the etching condition that gives the etching rate of the hard mask 23 larger than that of the $P^+$ and $N^+$ polycrystalline silicon films 8, 9 and that shows a large etching selectivity of the hard mask 23 to the $P^+$ and $N^+$ polycrystalline silicon films 8, 9.

Figure 7:
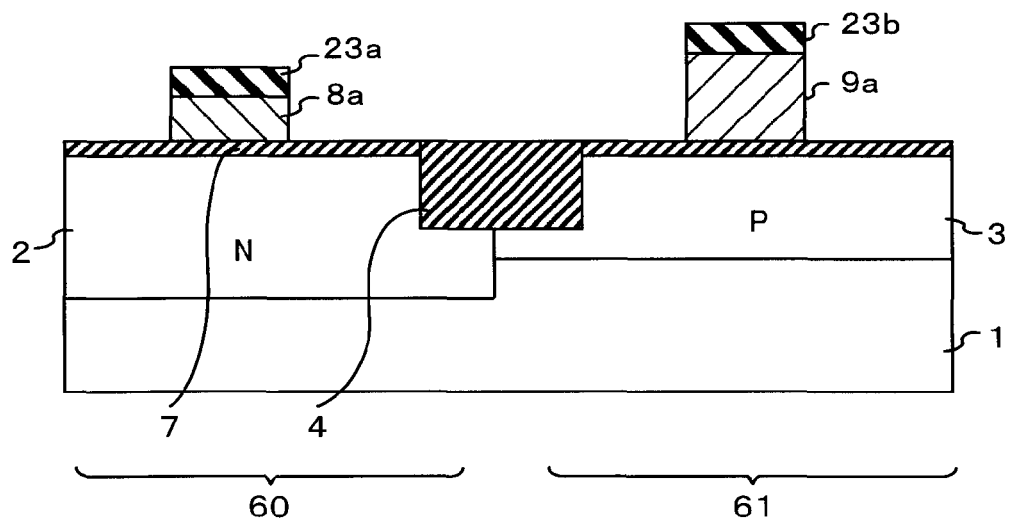

The resist film 22b is removed. After the removal of the resist film 22b, As shown in FIG. 7, the $P^+$ and $N^+$ polycrystalline silicon films 8, 9 are etched together utilizing a RIE method, for example, using the hard mask patterns 23a, 23b as etching masks. As a result, gate electrode films 8a, 9a are formed simultaneously.

It is desirable that the RIE method is carried out under the etching condition which gives the etching rate of the $P^+$ and $N^+$ polycrystalline silicon films 8, 9 larger than that of the hard mask patterns 23a, 23b and which shows a large etching selectivity of the $P^+$ and $N^+$ polycrystalline silicon films 8, 9 to the hard mask patterns 23a, 23b. It is preferable to adopt a RIE using hydrogen bromide (HBr) or chlorine ($Cl_2$) as an etching gas.

Figure 8:
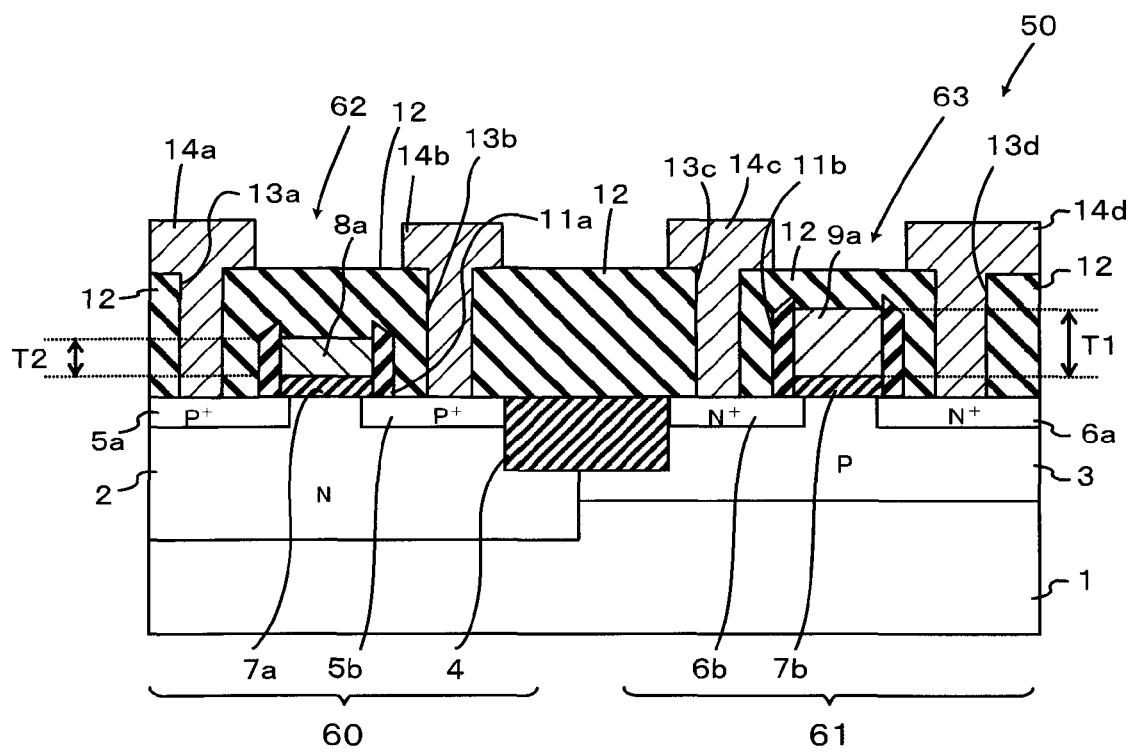

Further, as shown in FIG. 8, gate insulating films 7a, 7b are formed by etching the insulating film 7 using the gate electrode films 8a, 9a as etching masks.

The $P^+$ and $N^+$ polycrystalline silicon films 8, 9 may be etched simultaneously utilizing a RIE method using a resist film, not the hard mask patterns 23a, 23b, as an etching mask.

In FIG. 8, high-concentration P type impurities, for example, boron (B) ions are implanted using the gate electrode film 8a of $P^+$ polycrystalline silicon as a mask to obtain P-type source and drain layers 5a, 5b. High-concentration N type impurities, for example, phosphorus (P) ions are implanted using the gate electrode film 9a of $N^+$ polycrystalline silicon as a mask to obtain N-type source and drain layers 6a, 6b. The P-type source and drain layers 5a, 5b are apart from each other. The N-type source and drain layers 6a, 6b are apart from each other.

The region between the source and drain layers 5a, 5b is a first channel region. The region between the source and drain layers 6a, 6b is a second channel region. The source and drain layers 5a, 5b, 6a and 6b are shallower than the shallow trench isolation layer 4.

The side surfaces of the laminated films that are composed of the gate insulating film 7a, the gate electrode film 8a and the hard mask pattern 23a are covered with a side-wall insulating film 11a. The side surfaces of the laminated films that are composed of the gate insulating film 7b, the gate electrode film 9a and the hard mask pattern 23b are covered with a side-wall insulating film 11b.

The hard mask patterns 23a, 23b are removed so that the surfaces of the gate electrode films 8a, 9a are exposed. Further, an interlayer insulating film 12 is formed to cover the entire surface of the semiconductor substrate 1.

Contact holes 13a to 13d are formed in the interlayer insulating film 12 to expose portions of the source and drain layers 5a, 5b and 6a, 6b. Further, first-layer interconnections 14a to 14d are formed to bury the contact holes 13a to 13d.

By the above steps, a P-channel MISFET 62 is formed on the N-type well region 2. An N-channel MISFET 63 is formed on the P-type well region 3. The P-channel MISFET 62 and the N-channel MISFET 63 form a semiconductor device 50.

In the above described manufacturing method, the side-wall insulating films 11a and the source and drain layers 5a, 5b of the P-channel MISFET 62 may be formed after low-concentration P-type diffusion layers, which are apart from each other in a channel direction and which are called as "extension regions", are formed in the surface region of the N-type well region 2.

The side-wall insulating films lib and the source and drain layers 6a, 6b of the N-channel MISFET 63 may be formed after low-concentration N-type diffusion layers, which are apart from each other in a channel direction and which are called as "extension regions", are formed in the surface region of the P-type well region 3.

According to the manufacturing method of the embodiment described above, the thickness of the $P^+$ polycrystalline silicon film 8, which will be used as the gate electrode 8a of the P-channel MISFET 62, is formed to be thinner than that of the $N^+$ polycrystalline silicon film 9 to be the gate electrode 9a of the N-channel MISFET 63 by the compensation thickness. By the step, the times to reach the etching end points of the $N^+$ and $P^+$ polycrystalline silicon films become substantially same when the etching is started at the same time.

As a result, substantially vertical processed shapes may be obtained for the gate electrodes 8a, 9a respectively. The insulating film 7 for the gate insulating films may be suppressed to be over-etched so that the surface portion of the semiconductor substrate 1 may be prevented from being scooped out.

In the embodiment, the polycrystalline silicon film 21 is employed to form the gate electrodes. Instead, an amorphous silicon film or a silicon germanium (SiGe) film may be used. The NO film is employed for the gate insulating film 7a, 7b to form Metal-Insulator-Semiconductor field effect transistors (MISFETs). Instead, a silicon thermal-oxidation film may be used to form Metal-Oxide-Semiconductor field effect transistors (MOSFETs).

In the above embodiment, the $N^+$ polycrystalline silicon film 9 is formed prior to the $P^+$ polycrystalline silicon film 8. However, the $P^+$ polycrystalline silicon film 8 may be formed prior to the $N^+$ polycrystalline silicon film 9. Before P-type and N-type impurities are doped into the polycrystalline silicon film 21, the polycrystalline silicon film 21 may be etched in the thickness direction, above the area 60 to form the P-channel MISFET.

In more detail, a resist film may be provided on the polycrystalline silicon film 21 above the area 61 to form the N-channel MISFET. Using the resist film as a mask, the polycrystalline silicon film 21 may be etched to be thinner above the area 60. Further, utilizing the resist film as a mask, P-type impurities may be doped into the polycrystalline silicon film 21 above the area 60.

Figure 9:
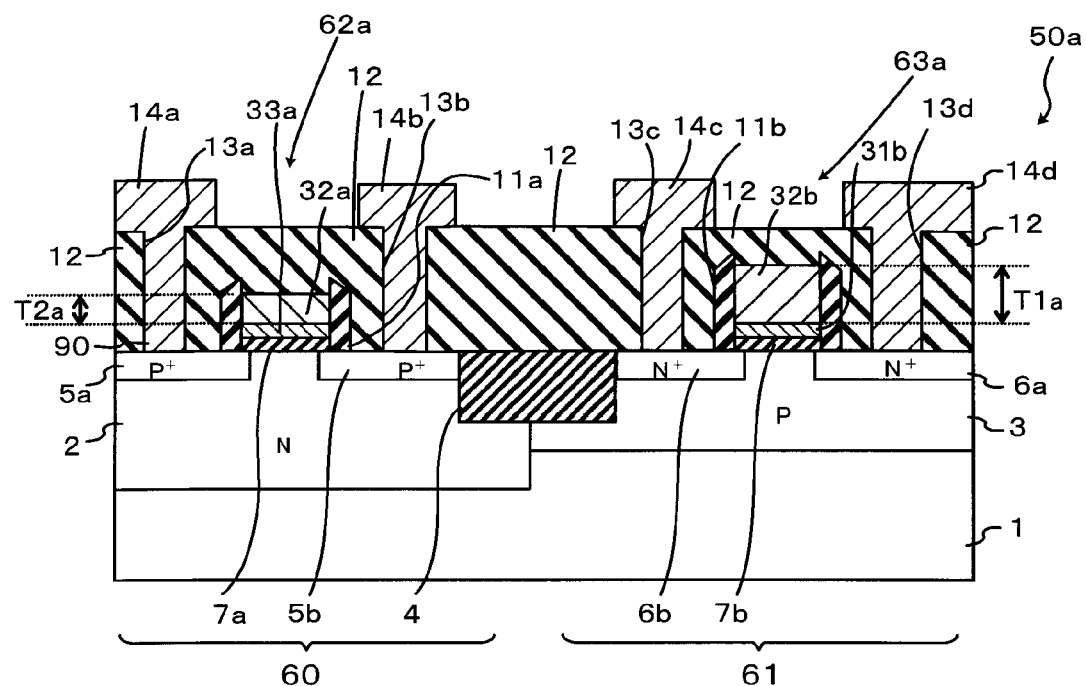
FIG. 9 is a cross-sectional view showing a first embodiment of a semiconductor device according to the present invention.

A first embodiment of a semiconductor device according to the invention will be described with reference to FIG. 9. FIG. 9 is a cross-sectional view showing the semiconductor device of the first embodiment. In FIG. 9, the same portions as those in FIGS. 1 to 8 are designated by the same reference numerals.

As shown in FIG. 9, N-type and P-type well regions 2, 3 are selectively formed in a surface region of a semiconductor substrate 1. $P^+$ source and drain layers 5a, 5b are selectively formed in a surface region of the N-type well region 2. $N^+$ source and drain layers 6a, 6b are selectively formed in a surface region of the P-type well region 3.

A shallow trench isolation layer 4 is formed in the surface region of the semiconductor substrate 1. The shallow trench isolation layer 4 isolates P-channel and N-channel MISFETs 62a, 63a. The shallow trench isolation layer 4 is buried more deeply than the $P^+$ source and drain layers 5a, 5b and the $N^+$ source and drain layers 6a, 6b.

A gate insulating film 7a, a lower gate electrode film 33a and an upper gate electrode film 32a are laminated on a region between the $P^+$ source and drain layers 5a, 5b. These laminated films overlap the $P^+$ source and drain layers 5a, 5b partially. A gate insulating film 7b, a lower gate electrode film 31b and an upper gate electrode film 32b are laminated on a region between the $N^+$ source and drain layers 6a, 6b. These laminated films overlap the $N^+$ source and drain layers 6a, 6b partially.

The $P^+$ source and drain layers 5a, 5b, the gate insulating film 7a, the lower gate electrode film 33a and the upper gate electrode film 32a form the P-channel MISFET 62a. The $N^+$ source and drain layers 6a, 6b, the gate insulating film 7b, the lower gate electrode film 31b and the upper gate electrode film 32b form the N-channel MISFET 63a. The P-channel and N-channel MISFET 62a, 63a form a semiconductor device 50a.

The side surfaces of the laminated films that are composed of the gate insulating film 7a and the lower and upper gate electrode film 33a, 32a are covered with a side-wall insulating film 11a.

The side surfaces of the laminated films that are composed of the insulating film 7b and the lower and upper gate electrode film 31b, 32b are covered with a side-wall insulating film 11b. An interlayer insulating film 12 is formed to cover the semiconductor substrate 1, the shallow trench isolation layer 4 and the side-wall insulating film 11a, 11b.

Contact holes 13a to 13d are formed in the interlayer insulating film to expose portions of the source and drain layers 5a, 5b and 6a, 6b. First-layer Interconnections 14a to 14d are formed to bury the contact holes 13a to 13d.

In the embodiment, tungsten nitride (WN) is used for the lower gate electrode film 33a above an area 60 of the semiconductor substrate 1 to form the P-channel MISFET 62a. Instead, tungsten (W), tungsten silicide (WSi), tungsten carbide (WC) and so forth may be used. Moreover, nickel (nickel), palladium (Pd), platinum (Pt), cobalt (Co), ruthenium (Ru) or rhodium (Rh) may be used which is a metal having a work function near that of a P+ polycrystalline silicon film. Further, nitride, silicide or carbide of each of the metals may be employed.

In the embodiment, titanium nitride (TiN) is used for the lower gate electrode film 31b above an area 61 of the semiconductor substrate 1 to form the N-channel MISFET 62a. Instead, titanium (Ti), titanium silicide (TiSi) or titanium carbide (TiC) may be used. Moreover, zirconium (Zr), hafnium (Hf), vanadium (V), tantalum (Ta), chromium (Cr), or molybdenum (Mo) may be used which is a metal having a work function near that of a N+ polycrystalline silicon film. Further, nitride, silicide or carbide of each of the metals may be employed.

The lower gate electrode film 33a, 31b have the same thickness approximately and take the same etching time substantially to etch in a thickness direction.

A P+ polycrystalline silicon film doped with high concentration P-type impurities is used for the upper gate electrode film 32a. An N+ polycrystalline silicon film doped with high concentration N-type impurities is used for the upper gate electrode film 32b.

When a high temperature heat treatment is necessary after the lower gate electrode film 33a, 31b are formed, barrier metal film are formed desirably between the lower gate electrode film 33a, 31b and the second gate electrode film 32a, 32b respectively to suppress producing silicide.

The following expressions are given to show the relationship between the thickness T2a of the upper gate electrode film 32a and the thickness T1a of the upper gate electrode film 32b.

$$T1a > T2a \quad (3)$$

$$T1a - T2a = \Delta Ta \quad (4)$$

The etching rate of the upper gate electrode film 32a is smaller than that of the upper gate electrode film 32b. The compensation thickness $\Delta Ta$ is determined so as to end etching tungsten nitride and titanium nitride films to form the lower gate electrode films 33a, 31b respectively, which are disposed under P+ and N+ polycrystalline silicon films to form the upper gate electrode films 31b, 32b, at the same time substantially, when the laminated tungsten nitride film and P+ polycrystalline silicon film and the laminated titanium nitride film and N+ polycrystalline silicon film started to be etched simultaneously and vertically (in a thickness direction) by a RIE processing.

According to the embodiment described above, the P+ polycrystalline silicon film to form the upper gate electrode 32a of the P-channel MISFET 62a is formed to be thinner than the N+ polycrystalline silicon film to form the upper gate electrode 32b of the N-channel MISFET 63a by the compensation thickness $\Delta Ta$. As a result, the times to reach the etching end points of the P+ and N+ polycrystalline silicon films (or the tungsten nitride and titanium nitride films) are substantially same when the etching processing is started at the same time.

Accordingly, substantially vertical processed shapes may be obtained for the laminated lower and upper gate electrodes 33a, 32a and the laminated lower and upper gate electrodes 31b, 32b. The insulating film to be the gate insulating film 7a, 7b may be suppressed to be over-etched so that the surface portion of the semiconductor substrate 1 may be prevented from being scooped out.

In the embodiment, the upper gate electrode film 32a of P+ polycrystalline silicon is formed on the lower gate electrode film of tungsten nitride which is formed on the gate insulating film 7a. Further, the upper gate electrode film 32b of N+ polycrystalline silicon is formed on the lower gate electrode film of titanium nitride which is formed on the gate insulating film 7b. According to the structures, deterioration of driving capability of the P-channel and N-channel MISFET 62a, 63a may be suppressed which is caused by increase in appearance of the thickness of the gate insulating films due to enhancement of gate depletion, in comparison with the case that the P+ and N+ polycrystalline silicon films 32a, 32b are formed directly on the gate insulating film 7a, 7b respectively. In addition, the boron (B) contained in the P+ polycrystalline silicon film may be suppressed to permeate so that the threshold voltage (Vth) of the P-channel MISFET 62a may be suppressed to change.

A second embodiment of a method of manufacturing a semiconductor device according to the invention will be described with reference to FIGS. 10 to 16. The manufacturing method of the second embodiment is a method of manufacturing the semiconductor device 50a which has been explained with reference to FIG. 9. FIGS. 10 to 16 are cross-sectional views showing manufacturing steps of the second embodiment. In FIGS. 10 to 16, the same portions as those in FIGS. 1 to 8 are designated by the same reference numerals.

Figure 10:
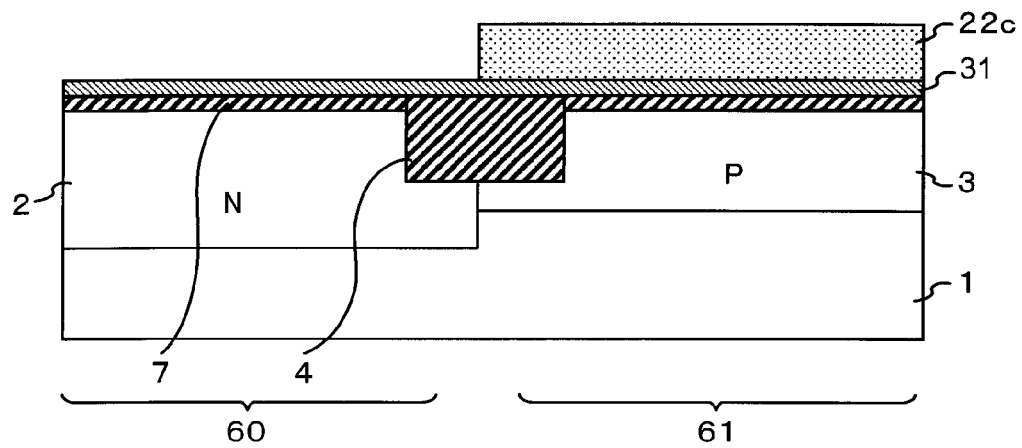
FIGS. 10 to 16 are cross-sectional views showing steps of a second embodiment of a method of manufacturing a semiconductor device according to the invention.

As shown in FIG. 10, a semiconductor substrate 1 of P-type silicon is prepared. N-type and P-type well regions 2, 3 are selectively formed in a surface region of the semiconductor substrate 1. A shallow trench isolation layer 4 is buried in a region including an adjacent portion of the N-type and P-type well regions 2, 3. An insulating film 7 is formed to serve as a gate insulating film.

A titanium nitride film (TiN) 31 is laminated on the insulating film 7 to form a lower gate electrode film 31b of FIG. 9. The titanium nitride film 31 is formed by a sputtering method. After the titanium nitride film 31 is formed, a resist film 22c is selectively formed on the area 61 to form an N-channel MISFET using a well-known lithography method. A portion of the titanium nitride film 31, that is located above the area 60 to form a P-channel MISFET, is removed by using the resist film 22c as an etching mask. It is desirable to employ the combination of dry and wet etching or wet etching to avoid causing damage to the insulating film 7.

Figure 11:
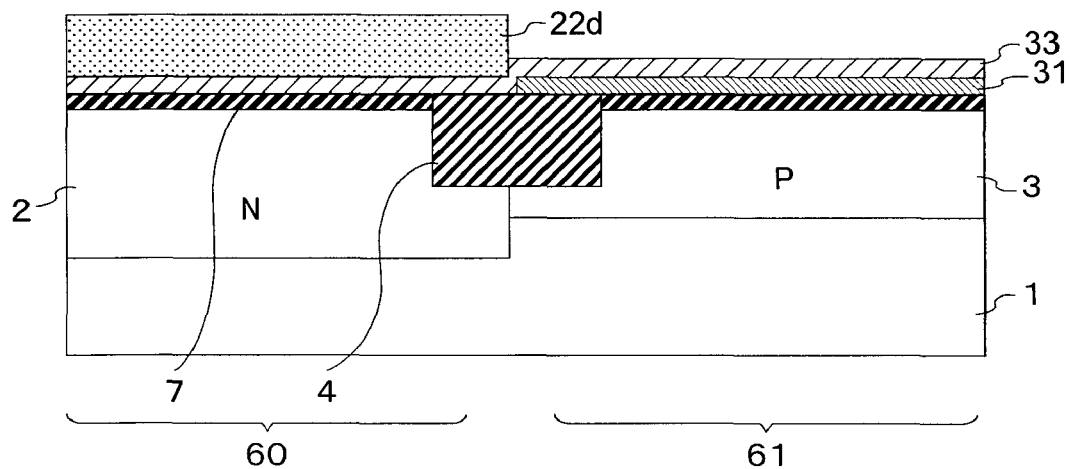

In FIG. 11, after removing the resist film 22c, a tungsten nitride (WN) film 33 to be a lower gate electrode film 33a is formed. The tungsten nitride film 33 is formed by a sputtering method. After the tungsten nitride film 33 is formed, a resist film 22d is selectively formed above the area 60 to form a P-channel MISFET using a well-known lithography method. A portion of the tungsten nitride film 33, that is located above the area 61 to form an N-channel MISFET, is removed by using the resist film 22d as an etching mask.

Figure 12:
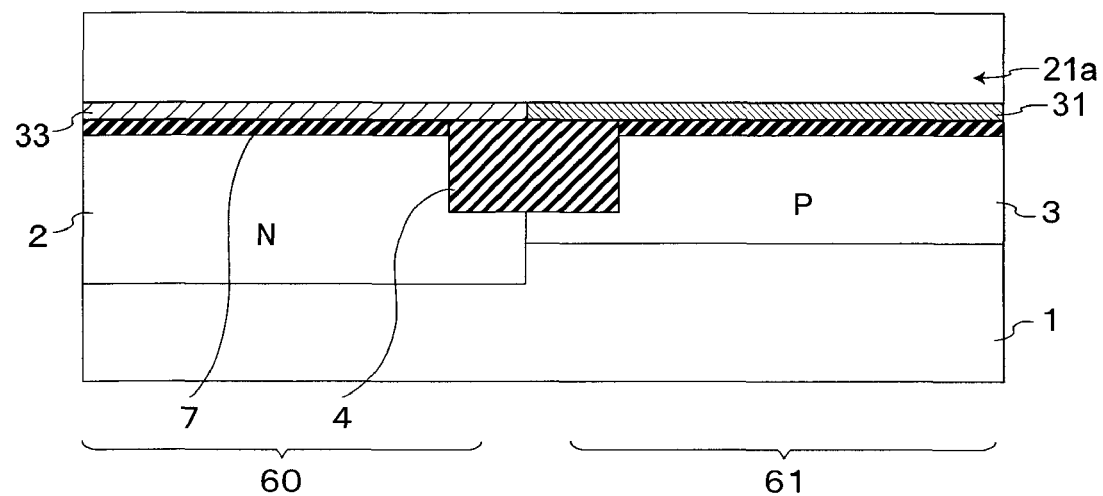

In FIG. 12, after removing the resist film 22d, an un-doped polycrystalline silicon film 21a is formed on the titanium nitride film 31 and the tungsten nitride film 33. The polycrystalline silicon film 21*a* may be formed by a CVD method or PVD method. In place of the un-doped polycrystalline silicon film 21*a*, an amorphous silicon film or a polycrystalline silicon germanium (SiGe) film may be used.

Figure 13:
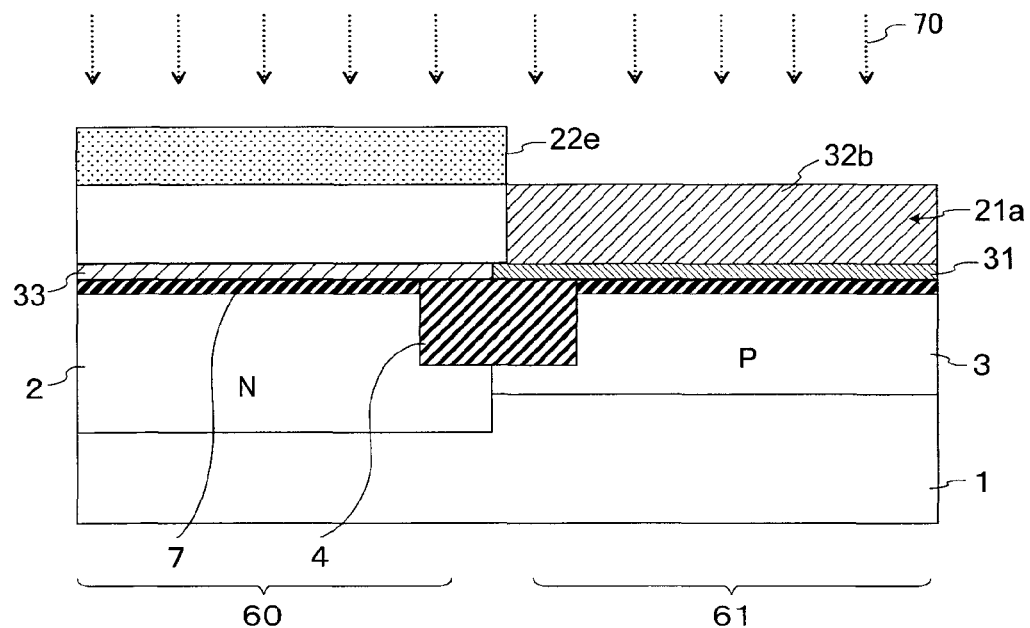

In FIG. 13, a resist film 22*e* is selectively formed on the area 60 to form the P-channel MISFET using a well-known lithography method. N-type impurities, for example, phosphorus (P) ions 70 are implanted into the polycrystalline silicon film 21*a* above the area 61 to form the N-channel MISFET so that an $N^+$ polycrystalline silicon film 32*b* is obtained.

Figure 14:
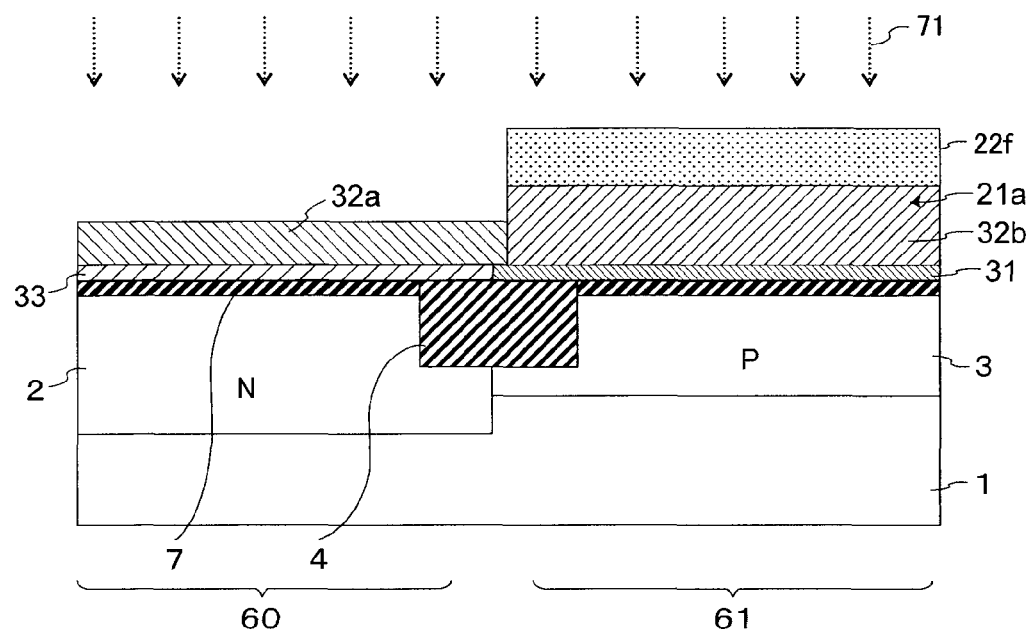

As shown in FIG. 14, after the resist film 22*e* is removed, a resist film 22*f* is selectively formed on the $N^+$ polycrystalline silicon film 32*b* above the area 61 to form the N-channel MISFET using a well-known lithography method. A portion of the polycrystalline silicon film 21*a*, which is located above the area 60 to form the P-channel MISFET, is etched by a predetermined thickness using a RIE method, for example.

The etching rates of a titanium nitride film and an $N^+$ polycrystalline silicon film and those of a tungsten nitride film and a $P^+$ polycrystalline silicon film are measured in order to decide the thickness to etch the portion of the polycrystalline silicon film 21*a*. It is desirable that the thickness to be etched is decided so as to realize that the times to reach the etching end points of the titanium nitride and tungsten nitride films are substantially same when the etching is started at the same time, in consideration of the measured etching rates of the titanium nitride film, the tungsten nitride film and the $N^+$ and $P^+$ polycrystalline silicon films and of the thicknesses of these films.

The difference between the thickness T1*a* of the $N^+$ polycrystalline silicon film and the thickness T2*a* of the $P^+$ polycrystalline silicon film is equivalent to a compensation thickness $\Delta Ta$ as shown in FIG. 9.

In FIG. 14, P-type impurities, for example, boron (B) ions 71 are implanted into the polycrystalline silicon film 21*a* above the area 60, using the resist film 22*f* as a mask, so as to form a $P^+$ polycrystalline silicon film 32*a* to obtain a second gate electrode film.

Figure 15:
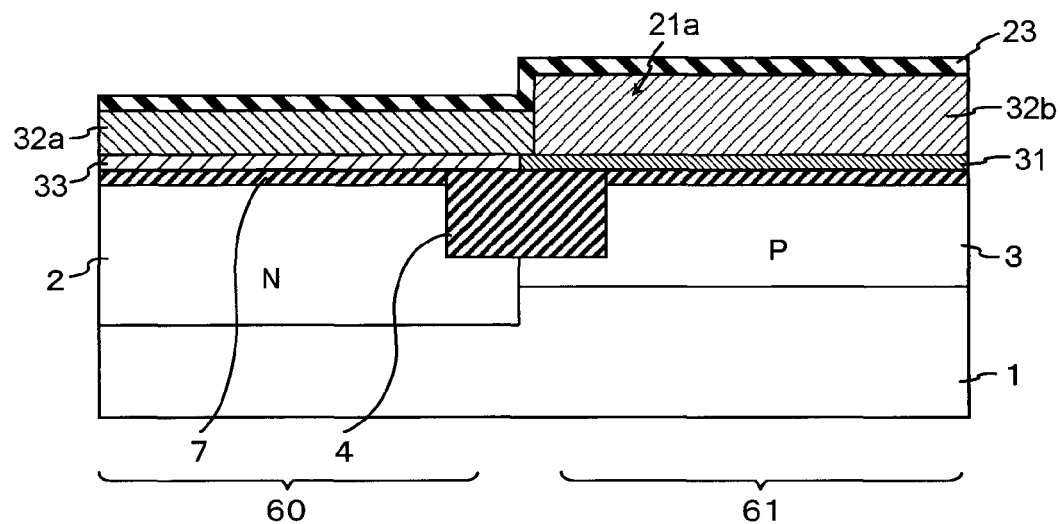

In FIG. 15, after the resist film 22*f* is removed, a hard mask 23 of a silicon-nitride (SiN) film is formed on the $P^+$ polycrystalline silicon film 32*a* and the $N^+$ polycrystalline silicon film 32*b*. The hard mask 23 may be formed by using a CVD method. In place of a silicon-nitride film, an insulating film such as a TEOS film may be used. After the hard mask 23 is formed, the impurities contained in the $P^+$ polycrystalline silicon film 32*a* and the $N^+$ polycrystalline silicon film 32*b* are diffused thermally to obtain a uniform impurity concentration of the $P^+$ polycrystalline silicon film 32*a* and the $N^+$ polycrystalline silicon film 32*b*.

Figure 16:
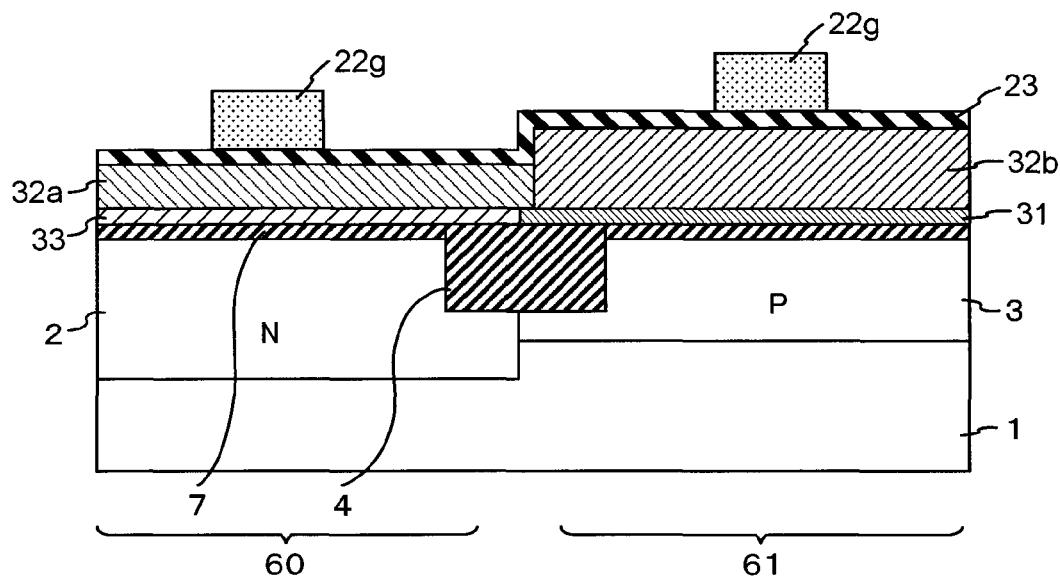

In FIG. 16, a resist film 22*g* is selectively formed above regions where gates will be formed, using a well-known lithography method. The hard mask 23 is etched utilizing a RIE method, for example, using the resist film 22*g* as an etching mask, so that hard mask patterns are formed. It is desirable that the RIE method is carried out under the etching condition that gives the etching rate of the hard mask 23 larger than that of the $P^+$ and $N^+$ polycrystalline silicon films 32*a*, 32*b* and that shows a large etching selectivity of the hard mask 23 to the $P^+$ and $N^+$ polycrystalline silicon films 32*a*, 32*b*.

The resist film 22*g* are removed. After the removal of the resist film 22*g*, the laminated titanium nitride film 31 and $N^+$ polycrystalline silicon film 32*b* above the area 61 and the laminated tungsten nitride film 33 and $P^+$ polycrystalline silicon film 32*a* above the area 60 start to be etched simultaneously utilizing a RIE method, for example, using the hard mask patterns as etching masks. As a result, lower gate electrode films 33*a*, 31*b* and upper gate electrode films 32*a*, 32*b* are formed as shown in FIG. 9.

The RIE method is carried out desirably under the etching condition that gives the etching rate of the $P^+$ and $N^+$ polycrystalline silicon films 32*a*, 32*b* and the titanium nitride and tungsten nitride films 31, 33 larger than those of the hard mask patterns and that shows a large etching selectivity between the hard mask patterns and the $P^+$ and $N^+$ polycrystalline silicon films 32*a*, 32*b* and the titanium nitride and tungsten nitride films 31, 33. It is preferable to adopt a RIE using hydrogen bromide (HBr) or chlorine ($Cl_2$) as an etching gas.

Gate insulating films 7*a*, 7*b* of FIG. 9 are formed by etching the insulating film 7 using the upper gate electrode films 32*a*, 32*b* as an etching mask. P-type source and drain layers 5*a*, 5*b*, N-type source and drain layers 6*a*, 6*b* and side-wall insulating film 11*a*, 11*b* are formed as the manufacturing method of the first embodiment. The hard mask patterns are removed.

Further, an interlayer insulating film 12 is formed, and Contact holes 13*a* to 13*d* are formed in the interlayer insulating film 12 to expose portions of the source and drain layers 5*a*, 5*b* and 6*a*, 6*b*. First-layer Interconnections 14*a* to 14*d* are formed to bury the contact holes 13*a* to 13*d*.

According to the manufacturing method of the second embodiment, the thickness of the portion of the polycrystalline silicon film 21*a* to be the $P^+$ polycrystalline silicon film 32*a* is formed to be thinner than that to be the $N^+$ polycrystalline silicon film 32*b* by the compensation thickness $\Delta Ta$. Accordingly, the times to reach the etching end points of the titanium nitride film 31 and the tungsten nitride film 33 are substantially same.

As a result, substantially vertical processed shapes may be obtained for the gate electrodes 8*a*, 9*a*. The insulating film 7 to be the gate insulating film may be suppressed to be over-etched so that the surface portion of the semiconductor substrate 1 may be prevented from being scooped out.

Figure 17:
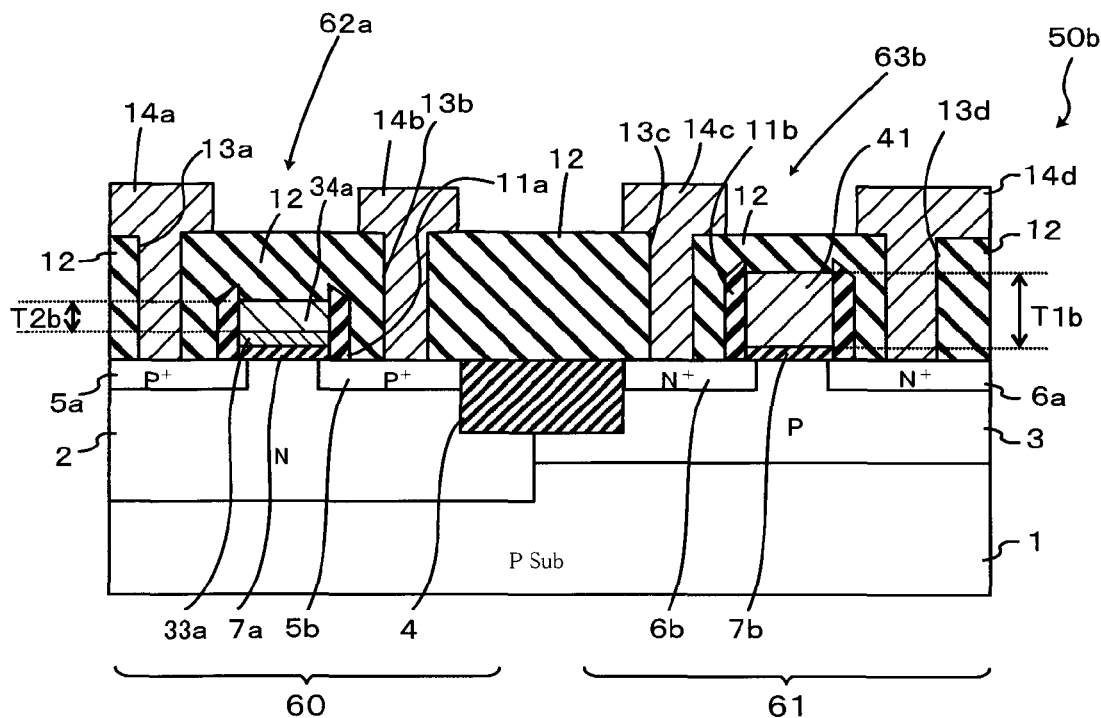
FIG. 17 is a cross-sectional view showing a second embodiment of a semiconductor device according to the invention.

A second embodiment of a semiconductor device according to the invention will be described with reference to FIG. 17. FIG. 17 is a cross-sectional view showing the semiconductor device of the second embodiment. In FIG. 17, the same portions as those in FIG. 9 are designated by the same reference numerals.

As shown in FIG. 17, N-type and P-type well regions 2, 3, $P^+$ source and drain layers 5*a*, 5*b*, $N^+$ source and drain layers 6*a*, 6*b* and a shallow trench isolation layer 4 are selectively formed in a surface region of a semiconductor substrate 1, as the semiconductor device 50*a* shown in FIG. 9.

A gate insulating film 7*a*, a first gate electrode film 33*a* and a second gate electrode film 34*a* are laminated on a region between the $P^+$ source and drain layers 5*a*, 5*b* in the semiconductor substrate 1. These laminated films overlap the $P^+$ source and drain layers 5*a*, 5*b* partially.

A gate insulating film 7*b* and a third gate electrode film 41 are laminated on a region between the $N^+$ source and drain layers 6*a*, 6*b*. These laminated films overlap the $N^+$ source and drain layers 6*a*, 6*b* partially.

The $P^+$ source and drain layers 5*a*, 5*b*, the gate insulating film 7*a*, the first gate electrode film 33*a* and the second gate electrode film 34*a* form a P-channel MISFET 62*a*. The $N^+$ source and drain layers 6*a*, 6*b*, the gate insulating film 7*b* and the third gate electrode film 41 form an N-channel MISFET 63*b*. The P-channel and N-channel MISFET 62*a*, 63*b* form a semiconductor device 50*b*.

The side surfaces of the laminated films that are composed of the gate insulating film 7*a* and the first and second gate electrode film 33*a*, 34*a* are covered with a side-wall insulating film 11*a*.

The side surfaces of the laminated films that are composed of the gate insulating film 7b and the third gate electrode film 41 are covered with a side-wall insulating film 11b. Structures of the other portions of the semiconductor device 50b are same as those of the semiconductor device 50a shown in FIG. 9.

A tungsten nitride (WN) film is used for the first gate electrode film 33a. A $P^+$ polycrystalline silicon film doped with high concentration P-type impurities is used for the second gate electrode film 34a. An $N^+$ polycrystalline silicon film doped with high concentration N-type impurities is used for the third gate electrode film 41. The semiconductor device according to the second embodiment is manufactured by the steps of the second embodiment as to the method of manufacturing the semiconductor device shown in FIGS. 10 to 16, with the step of forming the titanium nitride film excluded.

The following expressions are given to show the relationship between the thickness T1b of the third gate electrode film 41 and the thickness T2b of the second gate electrode film 34a.

$$T1b > T2b \quad (5)$$

$$T1b - T2b = \Delta Tb \quad (6)$$

The etching rate of the second gate electrode film 34a is smaller than that of the third gate electrode film 41. The second gate electrode film 34a is thinner than the third gate electrode film 41 by the compensation thickness $\Delta Tb$. The compensation thickness $\Delta Tb$ is determined so that the etching time of the laminated films of the first and second gate electrode film 33a, 34a above the area 60 may be substantially same as that of the third gate film 41 above the area 61, when the laminated films and the third gate electrode film 41 are start to be etched simultaneously and vertically (in a thickness direction) by a RIE processing.

The etching ending times are substantially same to reach the etching end points of the tungsten nitride film and the $N^+$ polycrystalline silicon film, when the laminated films of the $P^+$ polycrystalline silicon film and the tungsten nitride film and the $N^+$ polycrystalline silicon film start to be etched at the same time.

Accordingly, vertically processed shapes may be obtained for the laminated films and the $N^+$ polycrystalline silicon film. An insulating film to form the gate insulating film 7a, 7b may be suppressed to be over-etched so that the surface portion of the semiconductor substrate 1 may be prevented from being scooped out.

According to the semiconductor device of the second embodiment, the second gate electrode 34a of $P^+$ polycrystalline silicon is formed on the first gate electrode 33a of metal nitride, for example, tungsten nitride above the gate insulating film 7a of the P-channel MISFET 62a.

Thus, deterioration of driving capability of the P-channel MISFET 62a may be suppressed which is caused by increase in appearance of the thickness of the gate insulating film due to enhancement of gate depletion, in comparison with the case that the $P^+$ polycrystalline silicon films 34a is formed directly on the gate insulating film 7a.

In addition, the boron (B) contained in the $P^+$ polycrystalline silicon film may be suppressed to permeate so that the threshold voltage (Vth) of the P-channel MISFET 62a may be suppressed to change.

The N-channel MISFET 63b shows small change of the threshold voltage in comparison with a P-channel MISFET 62a, because the N-channel MISFET 63b do not cause the problem of permeation phenomenon of boron.

A third embodiment of a method of manufacturing a semiconductor device according to the invention will be described with reference to FIGS. 18 to 22. FIGS. 18 to 22 are cross-sectional views showing manufacturing steps of the third embodiment.

In FIGS. 18 to 22, the same portions as those in FIGS. 1 to 8 are designated by the same reference numerals.

Figure 18:
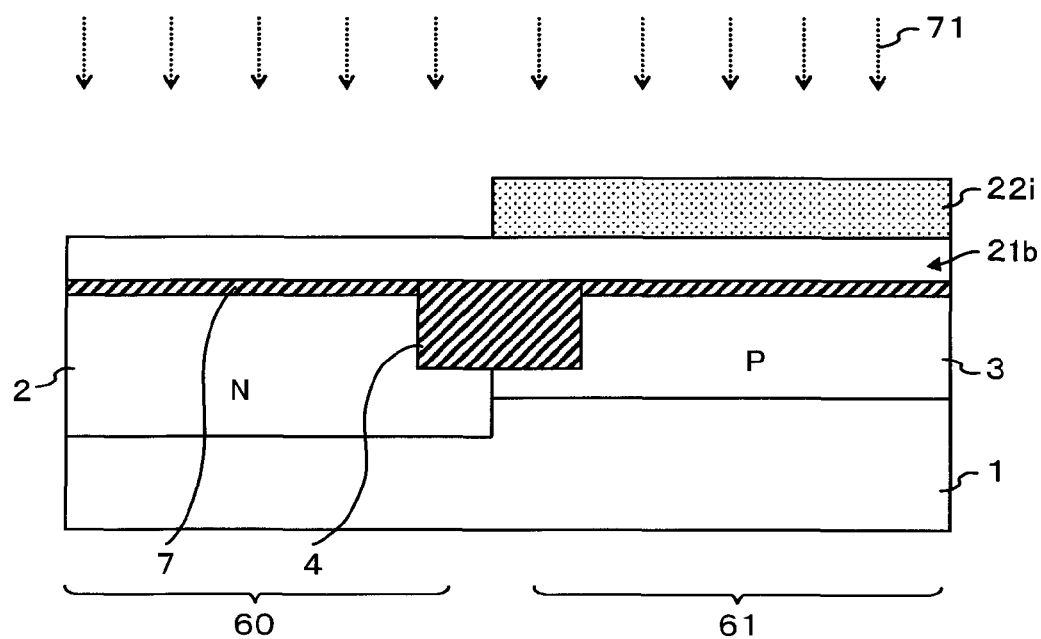
FIGS. 18 to 22 are cross-sectional views showing steps of a third embodiment of a method of manufacturing a semiconductor device according to the invention.

As shown in FIG. 18, a semiconductor substrate 1 is prepared. The semiconductor substrate 1 is a silicon substrate of P-type. An N-type well region 2 and a P-type well region 3 are selectively formed in a surface region of the semiconductor substrate 1. A shallow trench isolation layer 4 is buried in a region including an adjacent portion of the N-type and P-type well regions 2, 3 which is defined in the surface region of the semiconductor substrate 1. An insulating film 7 for a gate insulating film is formed on the semiconductor substrate 1.

A polycrystalline silicon film 21b is formed on the insulating film 7. The polycrystalline silicon film 21b is thinner than the polycrystalline silicon film 21 formed in the manufacturing method of the first embodiment. After the polycrystalline silicon film 21b is formed, a resist film 22i is selectively formed on the area 61 to form an N-channel MISFET using a well-known lithography method. P-type impurities, for example, boron (B) ions 71 are implanted into a portion of the polycrystalline silicon film 21b above the area 60 to form a P-channel MISFET using resist film 22i as a mask so that an $P^+$ polycrystalline silicon film 80 is obtained as shown in FIG. 19.

Figure 19:
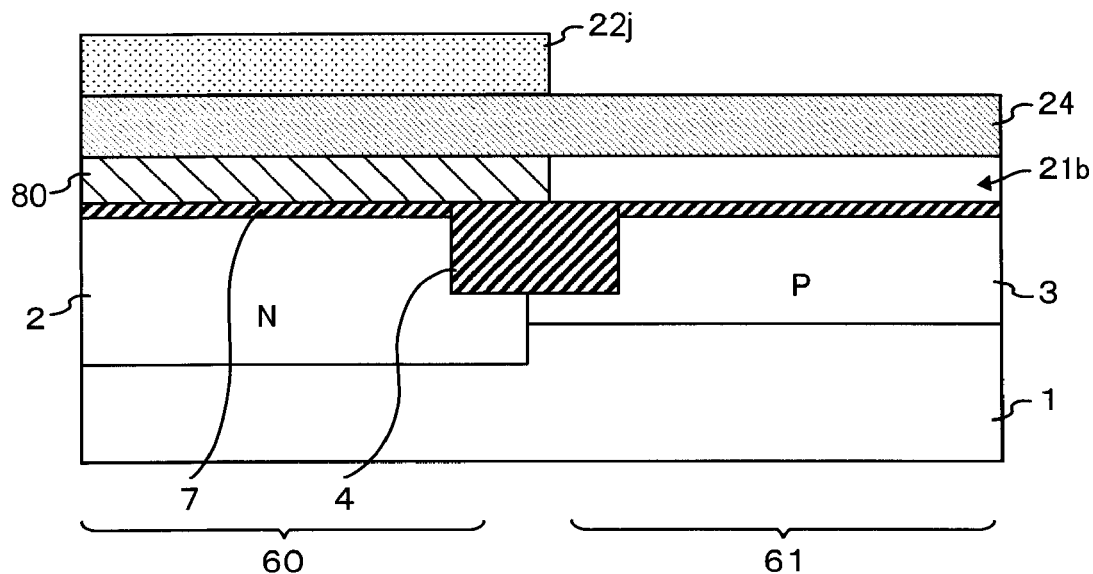

In FIG. 19, after the resist film 22i is removed, a protection film 24 is formed on the polycrystalline silicon film 21b. The protection film 24 serves as a mask material to flatten a polycrystalline silicon film in a CMP (Chemical Mechanical Polishing) method which will be described below. The protection film 24 has a polishing speed smaller than the polycrystalline silicon film. The protection film 24 is an insulating film such as a silicon nitride film desirably.

The thickness of the protection film 24 is equivalent to the compensation thickness $\Delta T$ described in the manufacturing method of the first embodiment desirably. After the protection film 24 is formed, s resist film 22j is selectively formed above the area 60 to form the P-channel MISFET using a well-known lithography method.

Figure 20:
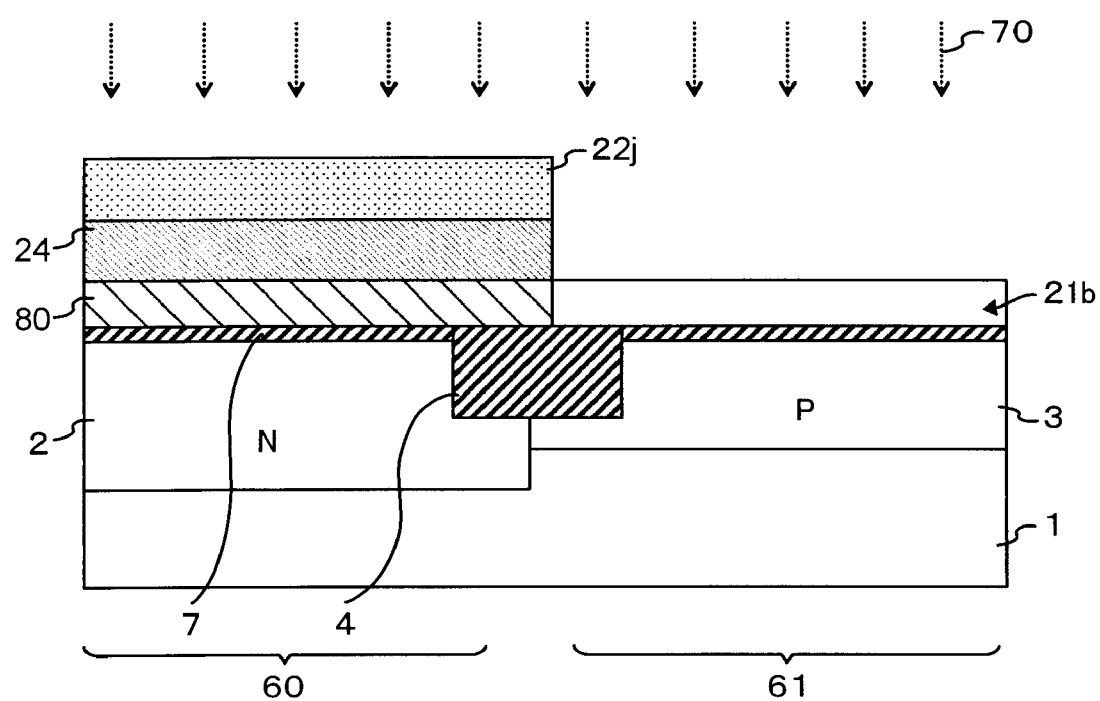

In FIG. 20, a portion of the surface of the polycrystalline silicon film 21b is exposed above the area 61 to form the N-channel MISFET by etching the protection film 24 using resist film 22j as a mask. N-type impurities, for example, phosphorus (P) ions 70 are implanted into the polycrystalline silicon film 21b above the area 61, using the resist film 22j as a mask, so as to form the N-channel MISFET. As a result, an $N^+$ polycrystalline silicon film 81 is obtained to be a gate electrode film. The resist film 22j is removed.

Figure 21:
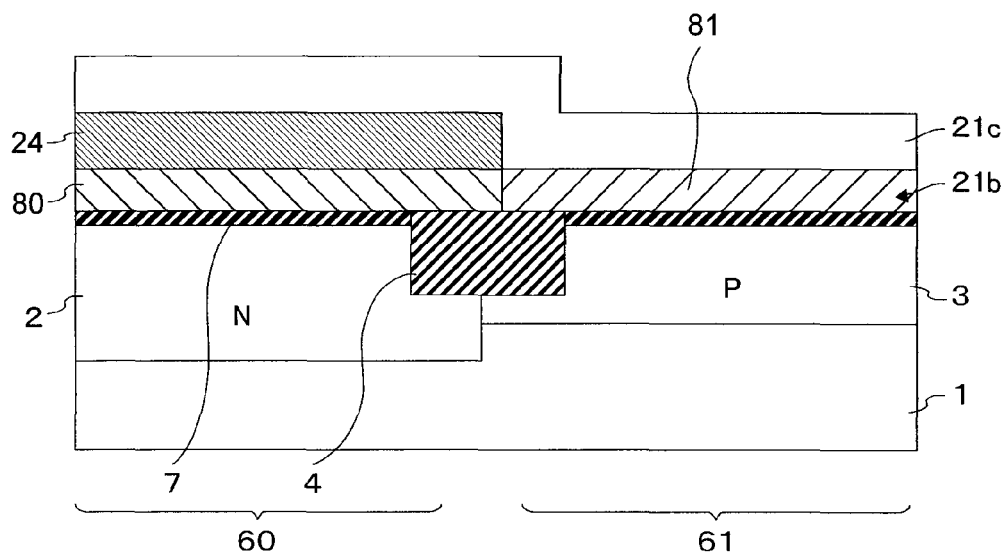

In FIG. 21, after the resist film 22j is removed, an $N^+$ polycrystalline silicon film 21c is formed by using a CVD method, for example, on the protection film 24 and the $N^+$ polycrystalline silicon film 21b. The thickness of the $N^+$ polycrystalline silicon film 21c is thicker than the thickness equivalent to the compensation thickness $\Delta T$ described in the manufacturing method of the first embodiment desirably.

An un-doped polycrystalline silicon film may be used in place of the $N^+$ polycrystalline silicon film 21c. When the $N^+$ polycrystalline silicon film 21c is used, the ion-implantation of the N-type impurities shown in FIG. 20 may be omitted. It may be sufficient that at least one of a portion of the polycrystalline silicon film 21b and a portion of the polycrystalline silicon film 21c respectively above the area 61 is doped with N-type impurities.

The polycrystalline silicon film 21c is flattened to the degree to expose the surface of the protection film 24 utilizing a CMP method. After the flattening, the protection film 24 is removed.

Figure 22:
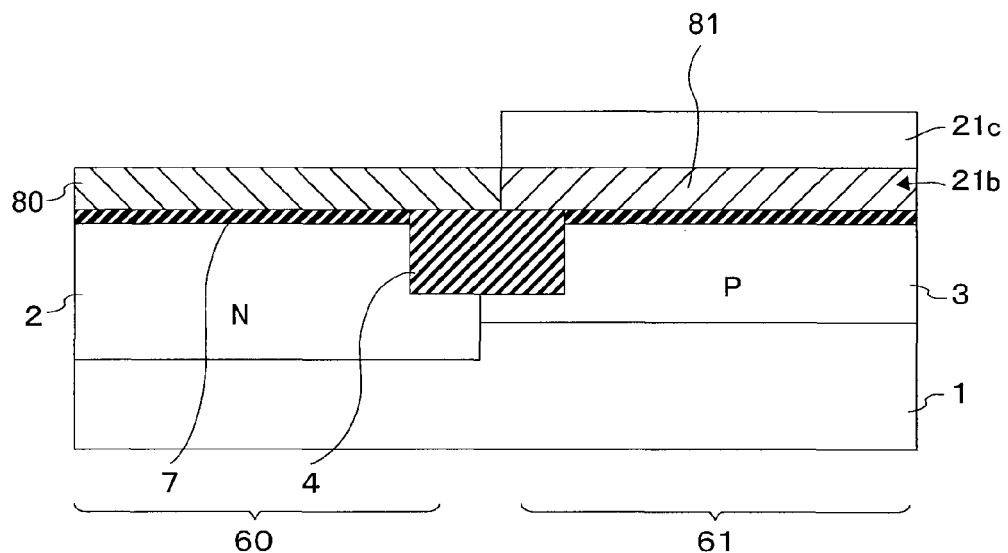

In FIG. 22, the polycrystalline silicon film 21c will remain on the N⁺ polycrystalline silicon film 81 selectively. The thickness of the polycrystalline silicon film 21c may be equivalent to the compensation thickness ΔT as described in the manufacturing method of the first embodiment. The remaining portion of the polycrystalline silicon film 21c forms a gate electrode of the N-channel MISFET together with the N⁺ polycrystalline silicon film 81.

When the protection film 24 is a silicon nitride (SiN) film, thermal phosphoric acid is desirably used to remove the protection film 24. A dry etching may also be used in the condition that the etching rate of the silicon nitride film is larger than that of a polycrystalline silicon film and that a large etching selectivity is shown between the silicon nitride film and the polycrystalline silicon film. When the protection film 24 is an insulating film other than a silicon nitride film, a wet etching is desirably used which etches the polycrystalline silicon film hardly.

A hard mask is formed on the P⁺ polycrystalline silicon film 80 and the polycrystalline silicon film 21 as shown in the step of FIG. 5 of the manufacturing method of the first embodiment. Impurities contained in the P⁺ polycrystalline silicon film 80 and those contained in the N⁺ polycrystalline silicon film 81, 21c are diffused thermally to uniform the impurity concentrations respectively. The hard mask is etched selectively to form hard mask patterns corresponding to gate electrodes.

The P⁺ polycrystalline silicon film 80 and the laminated films of the N⁺ polycrystalline silicon films 81, 21c are selectively etched simultaneously utilizing a RIE method, for example, using the hard mask patterns as etching masks. As a result, gate electrode films are formed above the areas 60, 61 to form the P-channel and N-channel MISFETs. The subsequent steps are same as those of the manufacturing method of the first embodiment.

In the embodiment, the thickness of the P⁺ polycrystalline silicon film 80 is formed to be thinner than that of the laminated films by the compensation thickness ΔT as the manufacturing method of the first embodiment. Thus, the times to reach the etching end points of the P⁺ polycrystalline silicon film 80 and the laminated films are substantially same when the etching starts at the same time.

As a result, vertical processing shapes may be obtained for the gate electrodes. The insulating film 7 to be the gate insulating film may be suppressed to be over-etched so that the surface portion of the semiconductor substrate 1 may be prevented from being scooped out.

A titanium nitride film and a tungsten nitride film may be formed after the insulating film 7 is formed and before the polycrystalline silicon film 21b is formed, as the titanium nitride film 31 and the tungsten nitride film 33 shown in FIGS. 10 to 12.

In the above-mentioned embodiment, the N⁺ polycrystalline silicon films are used for the most upper gate electrode films of the N-channel MISFETs respectively. The P⁺ polycrystalline silicon films are used for the most upper gate electrode films of the P-channel MISFETs respectively.

In order to lower the gate resistances of the P-channel and N-channel MISFETs, metal silicide films may be selectively formed on the gate electrode films respectively. Portions of the P⁺ and N⁺ polycrystalline silicon films may be silicide to lower the gate resistances.

Other embodiments or modifications of the present invention will be apparent to those skilled in the art from consideration of the specification and practice of the invention disclosed herein. It is intended that the specification and embodiments be considered as exemplary only, with a true scope and spirit of the invention being indicated by the following.

What is claimed is:

1. A semiconductor device, comprising:
a semiconductor substrate having a surface region, the surface region being provided with an N-type semiconductor region and a P-type semiconductor region;
a P-channel insulated gate field effect transistor formed on the N-type semiconductor region, the P-channel insulated gate field effect transistor having
a P-type source layer and a P-type drain layer formed apart from each other in the N-type semiconductor region,
a first insulating film formed on the N-type semiconductor region, and
a lower gate electrode film formed on the first insulating film and located above a region between the P-type source and drain layers and an upper gate electrode film containing silicon and P-type impurities formed on the lower gate electrode film, the lower gate electrode film being made of a material different from that of the upper gate electrode film and composed of at least one selected from a metal film, a metal nitride film, a metal silicide film and a metal carbide film; and
an N-channel insulated gate field effect transistor formed on the P-type semiconductor region, the N-channel insulated gate field effect transistor having
an N-type source layer and an N-type drain layer formed apart from each other in the P-type semiconductor region,
a second insulating film formed on the P-type semiconductor region, and
a third gate electrode film containing silicon and N-type impurities formed on the second insulating film and located above a region between the N-type source and drain layers, the third gate electrode film being thicker than the upper gate electrode film.

2. A semiconductor device according to claim 1, wherein the thickness difference between the upper and third gate electrode films is set to enable removing areas of the upper and third gate electrode films in a thickness direction in the same time under the same etching condition substantially.

3. A semiconductor device according to claim 1, further comprising:
a fourth gate electrode film formed between the second insulating film and the third gate electrode film, the fourth gate electrode film being made of a material different from that of the third gate electrode film.

4. A semiconductor device according to claim 3, wherein the lower and fourth gate electrode films are respectively a film composed of at least one selected from a metal film, a metal nitride film, a metal silicide film or a metal carbide film.

5. A semiconductor device according to claim 4, wherein the lower and fourth gate electrode films have respective thickness such that areas of the lower and fourth gate electrode films are capable of being removed in a thickness direction in the same time under the same etching condition substantially.

6. A semiconductor device according to claim 5,
wherein the lower and fourth gate electrode films have the same thickness approximately.

7. A semiconductor device according to claim 5,
wherein the lower and fourth gate electrode films are composed of different materials.

8. A semiconductor device according to claim 7,
wherein the lower gate electrode film contains at least one metal selected from tungsten (W), nickel (Ni), palladium (Pd), platinum (Pt), cobalt (Co), ruthenium (Ru) or rhodium (Rh), and the fourth gate electrode film contains at least one metal selected from titanium (Ti), zirconium (Zr), hafnium (Hf), vanadium (V), tantalum (Ta), chromium (Cr) or molybdenum (Mo).

9. A semiconductor device according to claim 1,
wherein the P-type impurities of the upper gate electrode film are boron and the N-type impurities of the third gate electrode film are phosphorus.

10. A semiconductor device according to claim 2,
wherein the P-type impurities of the upper gate electrode film are boron and the N-type impurities of the third gate electrode film are phosphorus.

11. A semiconductor device according to claim 3,
wherein the P-type impurities of the upper gate electrode film are boron and the N-type impurities of the third gate electrode film are phosphorus.

12. A semiconductor device according to claim 4,
wherein the P-type impurities of the upper gate electrode film are boron and the N-type impurities of the third gate electrode film are phosphorus.

13. A semiconductor device according to claim 5,
wherein the P-type impurities of the upper gate electrode film are boron and the N-type impurities of the third gate electrode film are phosphorus.

14. A semiconductor device according to claim 6,
wherein the P-type impurities of the upper gate electrode film are boron and the N-type impurities of the third gate electrode film are phosphorus.

15. A semiconductor device according to claim 7,
wherein the P-type impurities of the upper gate electrode film are boron and the N-type impurities of the third gate electrode' film are phosphorus.

16. A semiconductor device according to claim 8,
wherein the P-type impurities of the upper gate electrode film are boron and the N-type impurities of the third gate electrode film are phosphorus.

\* \* \* \* \*